United States Patent
Kwong et al.

(10) Patent No.: US 7,285,432 B2
(45) Date of Patent: *Oct. 23, 2007

(54) STRUCTURE AND METHOD OF FABRICATING ORGANIC DEVICES

(75) Inventors: Raymond Kwong, Plainsboro, NJ (US); Min-Hao Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,978

(22) Filed: Oct. 12, 2005

(65) Prior Publication Data

US 2006/0029725 A1    Feb. 9, 2006

Related U.S. Application Data

(63) Continuation of application No. 10/295,808, filed on Nov. 15, 2002, now Pat. No. 6,982,179.

(51) Int. Cl.
*H01L 21/20* (2006.01)

(52) U.S. Cl. .................... 438/22; 438/99; 257/51.03

(58) Field of Classification Search ............ 438/22–35, 438/99; 427/66–68
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,427,858 A | 6/1995 | Nakamura et al. |
| 5,503,910 A | 4/1996 | Matsuura et al. |
| 5,518,824 A | 5/1996 | Funhoff et al. |
| 5,552,253 A | 9/1996 | Kovacs et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 5,851,709 A | 12/1998 | Grande et al. |
| 5,853,905 A | 12/1998 | So et al. |
| 5,922,481 A | 7/1999 | Etzbach et al. |
| 5,929,194 A | 7/1999 | Woo et al. |

(Continued)

FOREIGN PATENT DOCUMENTS

EP    0 954 205    11/1999

(Continued)

OTHER PUBLICATIONS

A.B. Chwang, et al., "Graded mixed-layer organic light-emitting devices", Applied Physics Letters, vol. 80, No. 5, pp. 725-727, Feb. 4, 2002.

(Continued)

*Primary Examiner*—Savitri Mulpuri
(74) *Attorney, Agent, or Firm*—Kenyon & Kenyon LLP

(57) ABSTRACT

A method of fabricating an organic light emitting device is provided. A first organic layer is deposited over a first electrode. A second organic layer comprising a small molecule organic material is then deposited using solution processing over and in physical contact with the first organic layer, such that the first organic layer is insoluble in the solution used to deposit the second organic layer. A second electrode is then deposited over the second organic layer.

27 Claims, 3 Drawing Sheets

U.S. PATENT DOCUMENTS

| | | | |
|---|---|---|---|
| 6,013,982 | A | 1/2000 | Thompson et al. |
| 6,066,357 | A | 5/2000 | Tang et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,107,452 | A | 8/2000 | Miller et al. |
| 6,130,001 | A | 10/2000 | Shi et al. |
| 6,221,438 | B1 | 4/2001 | Matthies |
| 6,228,436 | B1 | 5/2001 | Affinito |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,372,154 | B1 | 4/2002 | Li |
| 6,468,819 | B1 | 10/2002 | Kim et al. |
| 6,592,969 | B1 | 7/2003 | Burroughes et al. |
| 6,803,720 | B2 | 10/2004 | Kwong et al. |
| 6,821,553 | B2 | 11/2004 | Miyashita et al. |
| 2001/0003602 | A1 | 6/2001 | Fujita |
| 2002/0067123 | A1 | 6/2002 | Seki et al. |
| 2002/0074935 | A1 | 6/2002 | Kwong et al. |
| 2002/0093283 | A1 | 7/2002 | Seo et al. |
| 2003/0054186 | A1 | 3/2003 | Miyashita et al. |
| 2003/0068525 | A1 | 4/2003 | Bellmann et al. |
| 2003/0230747 | A1 | 12/2003 | Ostergard |
| 2004/0037949 | A1 | 2/2004 | Wright |
| 2004/0048101 | A1 | 3/2004 | Thompson et al. |
| 2004/0069995 | A1* | 4/2004 | Magno et al. ............... 257/80 |
| 2004/0094768 | A1* | 5/2004 | Yu et al. ................... 257/79 |
| 2004/0189189 | A1 | 9/2004 | Burroughes et al. |

FOREIGN PATENT DOCUMENTS

| | | |
|---|---|---|
| JP | 10-162955 | 6/1998 |
| JP | 2002-158091 | 5/2002 |
| WO | WO98/24271 | 6/1998 |
| WO | WO99/21935 | 5/1999 |

OTHER PUBLICATIONS

Dongge Ma, et al., "Novel Heterolayer Organic Light-Emitting Diodes Based on a Conjugated Dendrimer", Adv. Funct. Mater. 2002, 12, No. 8, August.

Shih-Chun Lo, et al., "Green Phosphorescent Dendrimer for Light-Emitting Diodes", Adv. Mater. 2002, 14, No. 13-14, Jul. 4.

Benoit Domercq, et al., "Photo-Crosslinkable Polymers as Hole-Transport Materials for Organic Light-Emitting Diodes", Organic Photonic Materials and Devices IV, Proceedings of SPIE vol. 4642 (2002), pp. 88-96.

M. A. Baldo, et al., "Highly efficient phosphorescent emission from organic electroluminescent devices," Nature, Sep. 10, 1998, vol. 395, pp. 151-154.

M.A. Baldo, et al., "Very high-efficiency green organic light-emitting devices based on electrophosphorescence", Applied Physics Letters, vol. 75, No. 1, pp. 4-6, Jul. 5, 1999.

C. Adachi, et al., "Nearly 100% internal phosphorescence efficiency in an organic light emitting device", J. Appl. Phys. vol. 90, No. 10, pp. 5048-5051 (Nov. 15, 2001).

U.S. Appl. No. 10/173,682 to Forrest et al.

U.S. Appl. No. 09/931,948.

U.S. Appl. No. 10/233,470.

D. Müller, et al., "Novel cross-linkable hole-transport monomer for use in organic light emitting diodes", Synthetic Metals, 111-112, pp. 31-34, 2000.

S. Lamansky et al., "Highly Phosphorescent Bis-Cyclometalated Iridium Complexes: Synthesis, Photophysical Characterization, and Use in Organic Light Emitting Diodes", J. Am. Chem. Soc. 2001, vol. 123, No. 18, pp. 4304-4312.

S. Lamansky et al., "Synthesis and Characterization of Phosphorescent Cyclometalated Iridium Complexes", Inorg. Chem. 2001, vol. 40, No. 7, pp. 1704-1711.

A.E.A. Contoret, et al., "The Photopolymerization and Cross-Linking of Electroluminescent Liquid Crystals Containing Methacrylate and Diene Photopolymerizable End Groups for Multilayer Organic Light-Emitting Diodes", Chem. Mater. 2002, vol. 14, No. 4, pp. 1477-1487, Apr. 2002.

E. Bellmann, et al., "New Triarylamine-Containing Polymers as Hole Transport Materials in Organic Light-Emitting Diodes: Effect of Polymer Structure and Cross-Linking on Device Characteristics", Chem. Mater. 1998, vol. 10, No. 6, pp. 1668-1676.

G. Klämer, et al., "Cross-linkable Polymers Based on Dialkylfluorenes", Chem. Mater. 1999, vol. 11, No. 7, pp. 1800-1805.

A. Bacher, et al., "Photo-Cross-Linked Triphenylenes as Novel Insoluble Hole Transport Materials in Organic LEDs", Macromolecules 1999, vol. 32, No. 14, pp. 4551-4557.

S.J.M. O'Connor, et al., "Towards Full Colour LEP Displays", Proceedings of SPIE, vol. 4105, pp. 9-17, 2001.

J.P. Chen et al., "Efficient, blue light-emitting diodes using cross-linked layers of polymeric arylamines and fluorene", Synthetic Metals107, pp. 129-135, 1999.

T.R. Hebner, et al., "Local tuning of organic light-emitting diode color by dye droplet application", Applied Physics Letters, vol. 73, No. 13, pp. 1775-1777, Sep. 28, 1998.

Y. Kunugi, et al., "A Vapochromic LED", J. Am. Chem. Soc. 1998, vol. 120, No. 3, pp. 589-590.

K.M. Vaeth, et al., "Light emitting diodes based on phosphorescent guest/polymeric host systems", Journal of Applied Physics, vol. 92, No. 7, pp. 3447-3453, Oct. 1, 2002.

T. Shimoda, et al., "Current Status and Future of Light-emitting Polymer Display Driven by Poly-Si TFT", SID 99 Digest, pp. 372-375.

T. Shimoda, et al., "Multicolor Pixel Patterning of Light-Emitting Polymers by Ink-Jet Printing", SID 99 Digest, pp. 376-379.

H.N. Cho, et al., "Synthesis and luminescent characteristics of fluorene-based polymers containing diacetylene unit", Synthetic Metals 111-112, pp. 429-431, 2000.

Y. Zhang, et al., "Photo-crosslinkable polymers as hole-transport materials for organic light-emitting diodes", J. Mater. Chem., 2002, 12, pp. 1703-1708.

H. Krüger, et al., "Polymer multilayer systems for electronic applications", Synthetic Metals 127, pp. 267-271, 2002.

X. Li, et al., "A blue light emitting copolymer with charge transporting and photo-crosslinkable functional units", Synthetic Metals 84, pp. 437-438, 1997.

Yang et al. "Use of poly(9-vinylecarbazole) as host material for iridium complexes in high-efficiency organic light emitting devices", Jpn. J. Appl. Phys., vol. 399200) pp. 1828-1829.

Chen et al., "High-performance polymer light emitting diodes doped with red phophorescent iridium complex" Appl. Phys. Letters, vol. 80, No. 13.

* cited by examiner

STRUCTURE AND METHOD OF FABRICATING ORGANIC DEVICES

This application is a continuation of U.S. patent application Ser. No. 10/295,808, filed Nov. 15, 2002 now U.S. Pat. No. 6,982,179, which is related to concurrently filed patent application Ser. No. 10/295,802, filed Nov. 15, 2002, and Ser. No. 10/295,322, filed Nov. 15, 2002, all of which are incorporated by reference herein in their entireties.

FIELD OF THE INVENTION

The present invention relates to organic light emitting devices (OLEDs), and more specifically to organic devices having small molecule organic layers fabricated using solution processing.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

One of the main goals of OLEDs is realization of patterned full color flat panel displays in which the red, green and blue pixels are patterned deposited. Due to the difficulty of using masks for large area substrates using vapor phase deposition systems, for example substrates larger than about 0.5 meters in diameter, it is believed that patterning of the displays using ink jet printing of solution-processible materials may offer significant advantages. Ink jet printing techniques are believed to be particularly suitable for patterning the solution-processible polymers that are used in OLEDS having a polymer-based emissive layer. However, the selection of materials that may be used in such polymer-based systems is typically limited by the fact that the solution that is used as the carrier medium has to be selected so as to avoid dissolution of the underlying layer. A common choice is to use a PEDOT:PSS layer to provide hole injection and hole transport functions. PEDOT:PSS is soluble in water, but insoluble in certain organic solvents used to process polymer based emissive layers. As a result, solution processing may be used to deposit polymer based layers on PEDOT:PSS without dissolving the PEDOT:PSS.

High performance OLEDs, especially high performance electrophosphorescent OLEDs, typically require the presence of several layers that each perform separate functions. This means that it is highly desirable to be free to select from a wide variety of materials for each layer. For example, for high performance electrophosphorescent OLEDs, it is typically desirable to have two hole transport layers between the anode layer and the emissive layer. The first hole transport layer, which is in direct contact with the anode layer, is used primarily for its planarizing characteristics as well as for its more favorable hole injecting characteristics. This layer may be referred to as a hole injecting layer (HIL). The second hole transport layer (HTL), which may be in direct contact with the emissive layer is typically selected to have a high hole conductivity. This layer may also have the added function, at least in part, of blocking electrons and/or excitons.

SUMMARY OF THE INVENTION

A method of fabricating an organic light emitting device is provided. A first organic layer is deposited over a first electrode. A second organic layer comprising a small molecule organic material is then deposited using solution processing over and in physical contact with the first organic layer, such that the first organic layer is insoluble in the solution used to deposit the second organic layer. A second electrode is then deposited over the second organic layer.

DETAILED DESCRIPTION

Figure 1:
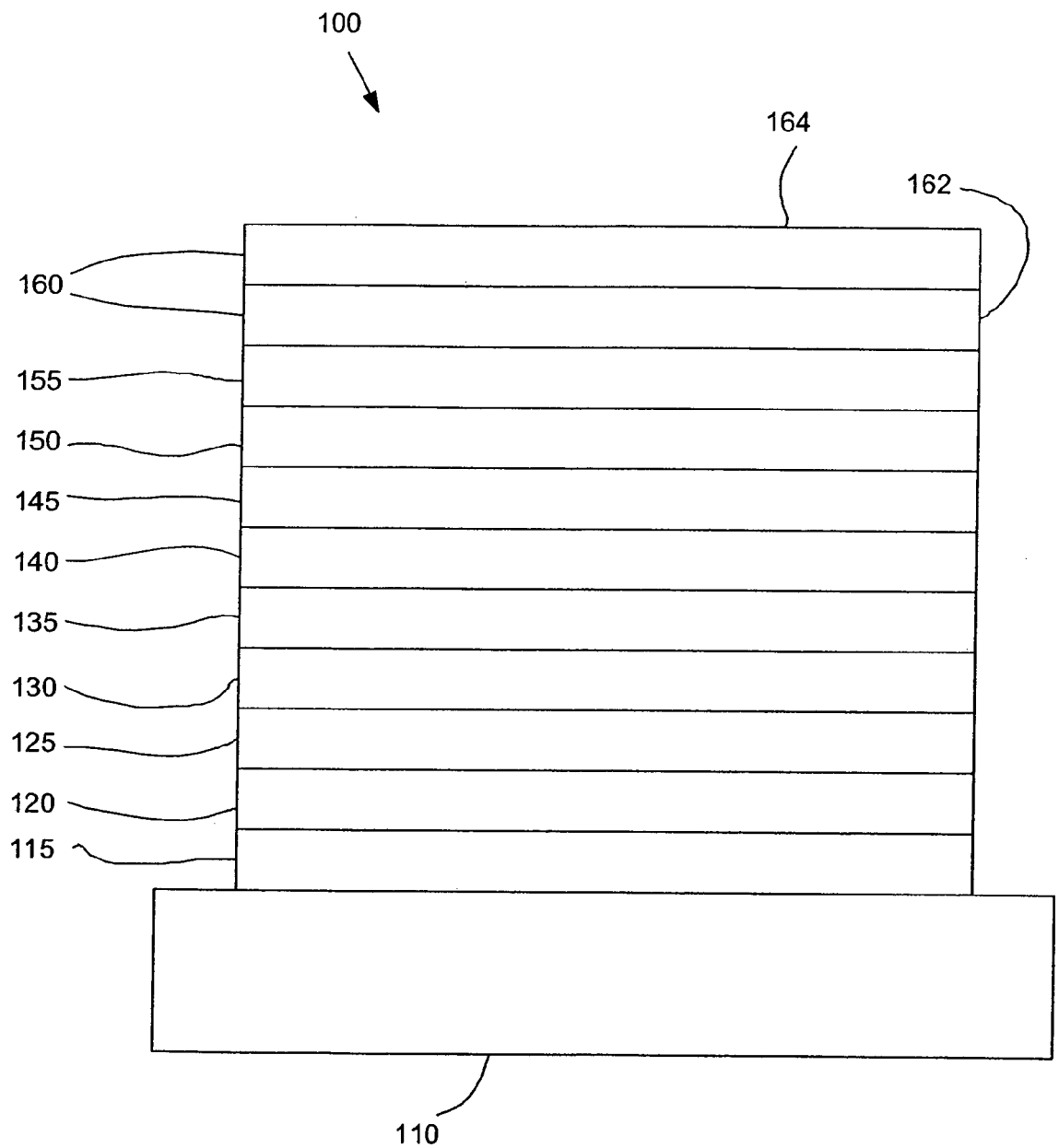
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
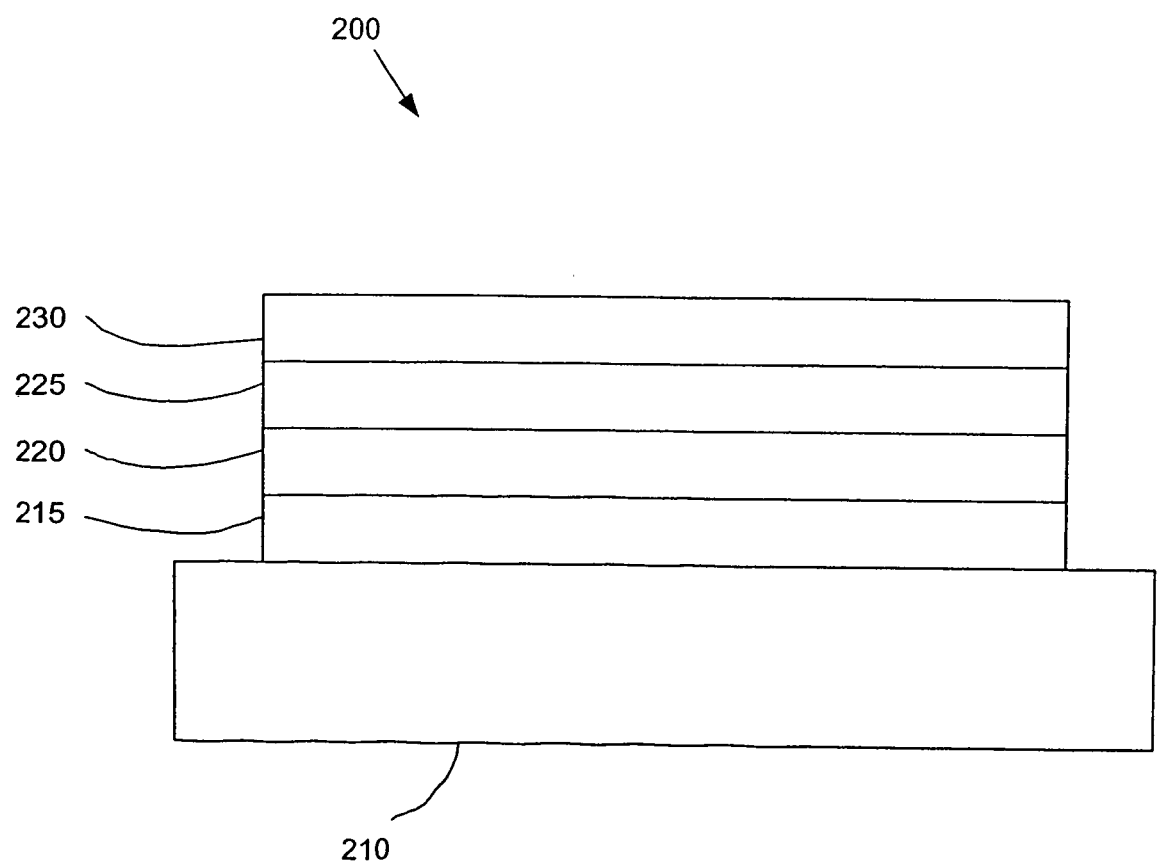
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 maybe used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and / or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In one embodiment, a method of fabricating a device using solution processing to deposit a small molecule organic layer is provided. As used herein, "Solution-processible" means capable of being dissolved, dispersed, or transported in and/or deposited from a liquid medium, either in solution or suspension form.

In a preferred embodiment, at least a small molecule emissive layer of the device is deposited by solution processing. Generally, a device or array of devices capable of emitting a variety of colors includes a patterned emissive layer having different regions capable of emitting different colors. Solution processing allows these patterned regions to be deposited without the use of shadow masks and other patterning techniques associated with vapor phase deposition.

Figure 3:
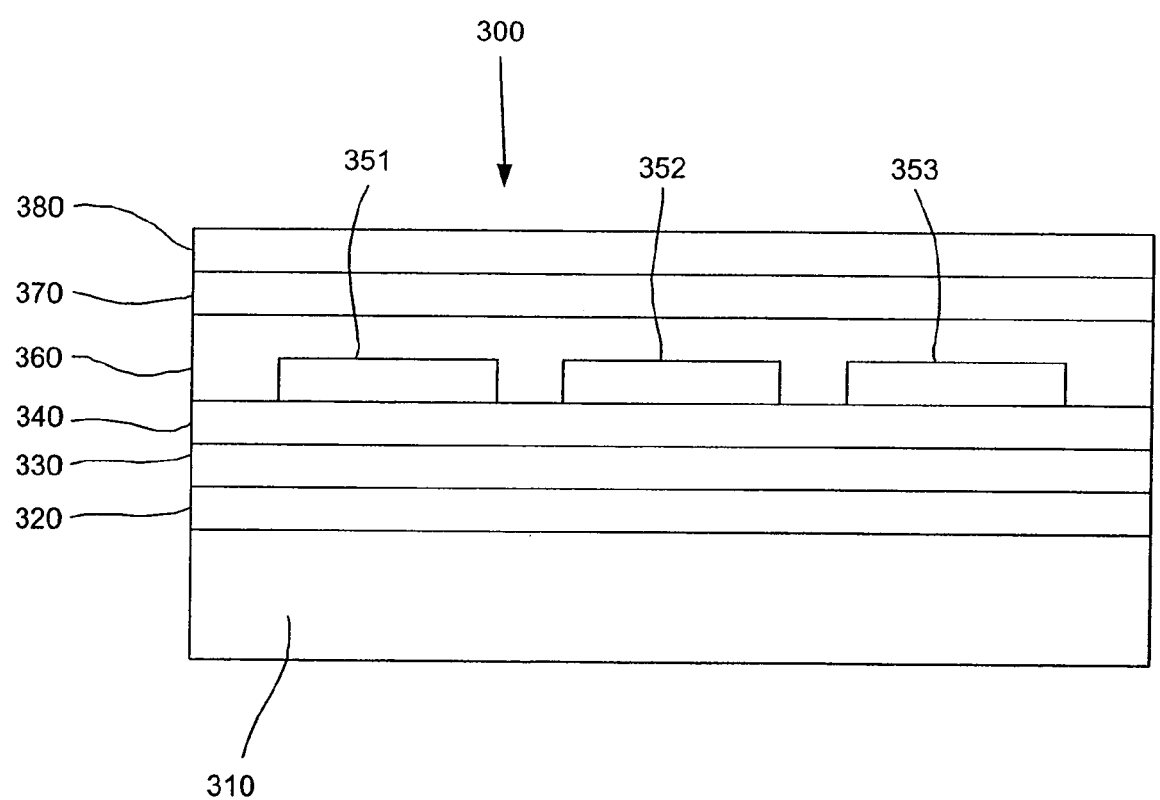
FIG. 3 shows an organic light emitting device having a solution processed layer in accordance with an embodiment of the invention.

FIG. 3 shows a device 300 that may include the use of solution processing to deposit a small molecule organic layer. Device 300 is fabricated over a substrate 310. Device 300 includes an anode 320, a hole injection layer 330, a hole transport layer 340. Device 300 further includes an emissive layer disposed over hole transport layer 340, where the emissive layer includes regions 351, 352 and 353 capable of emitting first, second and third spectra of light, respectively. Device 300 further includes an electron blocking layer 360, an electron transport layer 370, and a cathode 380.

Device 300 may be fabricated as follows. A substrate 310 having an anode 320 disposed thereon may be obtained or fabricated using any suitable technique. Anode 320 may be patterned. Hole injection layer 330 and hole transport layer 340 may be deposited using any suitable technique. In a preferred embodiment, hole injection layer 330 is PEDOT:PSS. The emissive layer is then deposited by solution processing. Solution processing methods include ink-jet printing and spin-coating. Ink-jet printing is preferred, because it readily allows for the patterning of separate regions 351, 352 and 353.

Hole transport layer 340 may be insoluble in the solvent used to deposit the emissive layer. Such insolubility may be achieved in a number of ways. For example, in one embodiment, the solvent used to deposit the emissive layer may be selected from a group of solvents in which hole transport layer 340 is not soluble. In another embodiment, hole transport layer 340 may be treated to render it insoluble in one or more solvents. For example, hole transport layer 340 may be cross-linked. Cross-linking can be achieved in a number of ways. Photochemical, thermal or a combination of both are preferred since they do not require the introduction of other materials. Such in-situ cross-linking has the advantage of avoiding interference from other materials. A material with a molecular structure that possesses more than one suitable cross-linkable group may be used to form the cross-linked layer. Suitable cross-linkable groups include but are not limited to acrylate, vinyl, diacetylene, epoxide and oxetane. A low percentage sensitizer or initiator, preferable less than 1%, can be incorporated in the layer 340 during its deposition to initiate cross-linking of the materials constituting layer 340. Layer 340 may also be a mixture of 2 or more materials, with at least one of them being cross-linkable. Crosslinking is described in more detail in Müller et al. Synthetic Metals, vol 111-112, page 31 (2002), and Miller et al. U.S. Pat. No. 6,107,452, which are incorporated by reference in their entireties.

By "insoluble," it is meant that hole transport layer does not significantly dissolve in the solvent used to deposit regions 351, 352 and 353 under the processing conditions used to deposit those regions. "Significant" dissolution means dissolution that results in greater than interfacial mixing. For example, mixing to a depth of up to 30 angstroms may be considered insignificant. The depth of mixing, may be determined using standard techniques know in the art, for example, Auger Electron Spectroscopy (AES), Secondary Ion Mass Spectrometry (SIMS), or X-ray Photoelectron Spectroscopy (XPS). Such techniques may be particularly useful, for example, for measuring the penetration depth of the metals, such as Ir or Pt, that are typically present in the preferred phosphorescent organometallic materials. Solubility may also be tested by dipping a layer of the material into the solvent at room temperature for one minute at room temperature, and observing the change in thickness. This test or similar tests may be adequate for many purposes, but may not exactly replicate process conditions.

Although FIG. 3 and the related description illustrate a small molecule emissive layer deposited by solution processing over an insoluble hole transport layer, it is understood that embodiments of the invention may include the deposition by solution processing of other types of organic layers. For example, many of the organic layers of the OLEDs described in FIGS. 1 and 2 are optional and may be omitted. An emissive small molecule organic layer may be deposited over and in physical contact with an insoluble organic layer that has any number of functions, including but not limited to a hole injection layer, a hole blocking layer, an electron blocking layer, an electron transport layer, and/or an electron injecting layer. The insolubility of these layers may be achieved in a number of ways as well, including but not limited to cross-linking, and choosing an organic layer that is not soluble in the solvent used to solution process the emissive layer (for example, PEDOT). Small molecule organic layers other than the emissive layer may be deposited over an insoluble organic layer.

Small molecule materials with significant intermolecular van de Waals interation such as π-π stacking may be insoluble in certain organic solvents. For example, polyaromatic compounds or aromatic macrocyclic compounds such as porphyrins, phthalocyanines, corrins and corroles may have significant π-π stacking which render them insoluble in a variety of solvents. These materials may be thermally deposited under vacuum to form the hole transporting layer. Another possible way to make the hole transporting layer organic-insoluble is to use an inorganic hole transporter. Such hole transporters may be deposited by chemical vapor deposition, sputtering or other suitable technique.

Cross-linking is also believed to increase the mechanical strength and thermal stability of the thin film layer. These improvements may translate into higher durability in electroluminescent devices. Cross-linking may also alter the electronic properties of the layer. For example, the cross-linked layer may have a higher charge conductivity or higher dielectric breakdown than the non-cross-linked layer.

The solution processing methods described herein may be used multiple times in a single device. For example, various solvent systems and/or crosslinking may be used to solution deposit multiple small molecule organic layers over previously deposited layers that are insoluble. Embodiments of the invention are not limited to the specific layers illustrated in FIGS. 1-3, and the methods described may be applied generally to any combination of organic layers that somewhere include a solution deposited small molecule organic material.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: naphthyl-phenyl-diamine
TPD: N,N'-bis(3-methylphenyl)-N,N'-bis-(phenyl)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS) (or the material that results after drying)

While the present invention is described with respect to particular examples and preferred embodiments, it is understood that the present invention is not limited to these examples and embodiments. The present invention as claimed therefore includes variations from the particular examples and preferred -embodiments described herein, as will be apparent to one of skill in the art.

What is claimed is:

1. A method of fabricating an organic light emitting device, comprising:
   (a) depositing a first organic layer over a first electrode;
   (b) depositing a second organic layer over and in physical contact with the first organic layer, wherein
      (1) the second organic layer comprises a small molecule emissive material,
      (2) the second organic layer is a patterned layer deposited by solution processing, and
      (3) the first organic layer is insoluble in the solution used to deposit the second organic layer; and
   (c) depositing a second electrode over the second organic layer; wherein the first organic layer comprises a cross linked material.

2. The method of claim 1, wherein the first organic layer is cross-linked thermally, photochemically, or a combination thereof.

3. The method of claim 1, wherein the first organic layer comprises at least one of NPD, an aromatic macrocyclic material, and a polyaromatic material.

4. The method of claim 1, wherein, prior to cross-linking, the cross-linked material comprises cross-likable groups selected from the group consisting of acrylate groups, vinyl groups, diacetylene groups, epoxide groups, oxetane groups, and a combination thereof.

5. The method of claim 3, wherein, prior to cross-linking, the cross-linked material comprises cross-likable groups selected from the group consisting of acrylate groups, vinyl groups, diacetylene groups, epoxide groups, oxetane groups, and a combination thereof.

6. The method of claim 4, wherein the cross-linkable groups comprise vinyl groups.

7. The method of claim 4, wherein the cross-linkable groups comprise acrylate groups.

8. The method of claim 4, wherein the cross-linkable groups comprise diacetylene groups.

9. The method of claim 4, wherein the cross-linkable groups comprise epoxide groups.

10. The method of claim 4, wherein the cross-linkable groups comprise oxetane groups.

11. The method of claim 5, wherein the first organic layer comprises NPD.

12. The method of claim 5, wherein the first organic layer comprises NPD, and the cross-linkable groups comprise vinyl groups.

13. The method of claim 5, wherein the first organic layer comprises NPD, and the cross-linkable groups comprise acrylate groups.

14. The method of claim 5, wherein the first organic layer comprises NPD, and the cross-linkable groups comprise diacetylene groups.

15. The method of claim 5, wherein the first organic layer comprises NPD, and the cross-linkable groups comprise epoxide groups.

16. The method of claim 5, wherein the first organic layer comprises NPD, and the cross-linkable groups comprise oxetane groups.

17. The method of claim 5, wherein the first organic layer comprises an aromatic macrocyclic material.

18. The method of claim 5, wherein the first organic layer comprises an aromatic macrocyclic material, and the cross-linkable groups comprise vinyl groups.

19. The method of claim 5, wherein the first organic layer comprises an aromatic macrocyclic material, and the cross-linkable groups comprise acrylate groups.

20. The method of claim 5, wherein the first organic layer comprises an aromatic macrocyclic material, and the cross-linkable groups comprise diacetylene groups.

21. The method of claim 5, wherein the first organic layer comprises an aromatic macrocyclic material, and the cross-linkable groups comprise epoxide groups.

22. The method of claim 5, wherein the first organic layer comprises an aromatic macrocyclic material, and the cross-linkable groups comprise oxetane groups.

23. The method of claim 5, wherein the first organic layer comprises a polyaromatic material.

24. The method of claim 5, wherein the first organic layer comprises a polyaromatic material, and the cross-linkable groups comprise vinyl groups.

25. The method of claim 5, wherein the first organic layer comprises a polyaromatic material, and the cross-linkable groups comprise acrylate groups.

26. The method of claim 5, wherein the first organic layer comprises a polyaromatic material, and the cross-linkable groups comprise diacetylene groups.

27. The method of claim 5, wherein the first organic layer comprises a polyaromatic material, and the cross-linkable groups comprise epoxide groups.

* * * * *